April 21, 1970 B. L. KRAVITZ 3,507,713

MONOLITHIC CIRCUIT CHIP CONTAINING NONCOMPATIBLE OXIDE-ISOLATED REGIONS

Filed July 13, 1966 2 Sheets-Sheet 1

INVENTOR.
Bernard L. Kravitz
BY
Shenier & O'Connor
ATTORNEYS

INVENTOR.
Bernard L. Kravitz
BY
Shenier & O'Connor
ATTORNEYS

United States Patent Office 3,507,713

Patented Apr. 21, 1970

3,507,713

MONOLITHIC CIRCUIT CHIP CONTAINING NONCOMPATIBLE OXIDE-ISOLATED REGIONS

Bernard L. Kravitz, Forest Hills, N.Y., assignor to United Aircraft Corporation, East Hartford, Conn., a corporation of Delaware Filed July 13, 1966, Ser. No. 564,777

Int. Cl. H01l 7/36

U.S. Cl. 148—175 3 Claims

ABSTRACT OF THE DISCLOSURE

In general my invention contemplates the provision of an integrated circuit slice containing noncompatible regions in which a substrate having a surface carries respective regions of material of different conductivity types extending into said substrate from said surface and surrounded below said surface by oxide isolating films and to a method of making the same. Each region comprises a layer of relatively high resistivity material superposed on a layer of relatively low resistivity to provide an ideal structure for formation of both p-n-p and n-p-n structures in the same slice.

BACKGROUND OF THE INVENTION

One of the most widely used microcircuit devices presently known is the epitaxial diffused base transistor. The ideal starting structure to form such a device is a relatively lightly doped or high resistivity layer on a highly doped or relatively lower resistivity layer. It will readily be apparent that for construction of a planar n-p-n type transistor, the material would be $n/n^+$ while for the formation of a p-n-p device the starting material would be $p/p^+$. It is desirable in many instances that p-n-p and n-p-n devices be incorporated in the same monolithic circuit chip. Various methods have been proposed in the prior art in an attempt to arrive at such a structure. All of these methods sacrifice either some design criteria or the freedom of choice of material which normally would be possible.

As has been pointed out hereinabove, the ideal form of the starting element is a thin homogeneous layer of lightly doped material on top of a relatively heavily doped region. Through the use of very involved sequences of diffusion, photoengraving and epitaxial layer growth, structures approaching noncompatible $n/n^+$ and $p/p^+$ regions in the same slice can be arrived at. They can never however, ideally be achieved with complete absence of nonhomogeneous layers or poorly controlled concentration or the complete restriction to relatively low resistivity epitaxial "islands" regrown inside an oxide window.

DESCRIPTION OF THE INVENTION

I have invented a monolithic integrated circuit slice or chip containing noncompatible regions in their ideal form and a method of making the same. My invention overcomes the defects of methods and structures of the prior art.

One object of my invention is to provide a monolithic integrated circuit chip containing noncompatible structures in their ideal form.

Another object of my invention is to provide a monolithic integrated circuit chip which facilitates the formation of both p-n-p and n-p-n devices in the same chip.

A further object of my invention is to provide a monolithic integrated circuit slice containing noncompatible regions, each of which comprises a relatively high resistivity film or layer over a relatively low resistivity layer.

A still further object of my invention is to provide a method of making a monolithic integrated circuit slice containing noncompatible regions of ideal form.

Other and further objects of my invention will appear from the following description.

Figure 1:
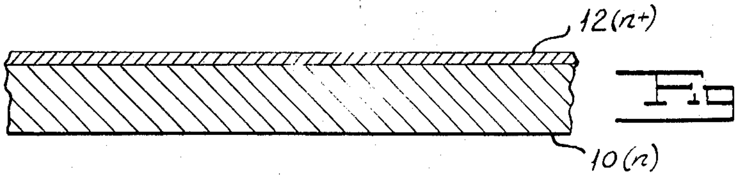
FIGURE 1 is a fragmentary sectional view of a silicon slice illustrating an initial step in the process of making my monolithic chip containing noncompatible oxide-isolated regions.

Referring now to FIGURES 1 to 4 of the drawings in the manufacture of my integrated circuit slice or chip containing noncompatible oxide-isolated regions, I may start with an n-type parent silicon slice 10 carrying a relatively more heavily doped $n^+$ layer 12. This structure can be produced by any of the methods known in the art. For example, starting with the parent body 10 a carrier gas such, for example, as hydrogen is allowed to bubble through a silicon halide and the mixture is passed over the heated substrate on which the silicon is epitaxially deposited. The remaining product of the reaction is removed. In order to achieve the desired heavy doping in the layer 12, I add a phosphorus or an arsenic halide to the gas stream to reduce the doping element along with the silicon, thus to produce the relatively heavily doped $n^+$ layer.

Since the technique of forming the body 10 with the layer 12 per se forms no part of my invention. I will not describe it in greater detail. Methods of producing the epitaxial films such, for example, as film 12, are more fully described in "Epitaxial Techniques in Semiconductor Devices" by Sigler and Watelski, published on pages 33 to 37 of "The Solid State Journal" of March 1961.

Having formed the body 10 and the layer 12 I next etch a plurality of grooves 14 extending in one direction and a plurality of intersecting grooves 16 into the body 10 through the layer 12. This can be accomplished by the well-known photoresist technique. In use of that technique, the photographic resist may be applied in liquid form by dipping or the like. When it dries the resist forms a thin plastic film which is photographically sensitive to ultra-violet light. I expose the film by contact printing, for example, to a positive of the pattern I desire to etch.

The exposed portions become insoluble in the developer so that resist material in the opaque areas of the pattern is removed by the developer. The assembly then is subjected to the action of a suitable etchant such, for example, as a combination of hydrofluoric and nitric acids for a predetermined length of time to etch the intersecting channels 14 and 16 in the body. This photoresist technique also being well known in the art and not per se forming a part of my invention, it will not be described in detail.

Having formed the desired grid of intersecting grooves extending through the film 12 and into the body 10, I next form a coating of oxide 18 over the exposed surface of the body 10 and the portions 20 of the coating 12 which remains after the etching operation has been performed. This oxide coating 18 may be provided in any suitable manner as by subjecting the slice to the action of steam at about 1000° C. for four to five hours. It will readily be appreciated that formation of the coating 18 results in a plurality of "islands" 20 of the remaining material of the coating 12, which islands are enclosed on three sides by the oxide film 18 and on the other surface by material of the body 10.

After I have applied the isolating oxide coating 18 I next apply supporting material 22 over the oxide film. As will be apparent from the description given hereinafter, the material 22 functions principally as a support for the structure to be described and does not itself perform any electrical function. While that is so, it is required that it be mechanically compatible with the material of which the body 10 is formed. For that reason, preferably I form the supporting structure 22 from silicon epitaxially deposited on the surface of the oxide coating in any manner known to the art.

Figure 2:
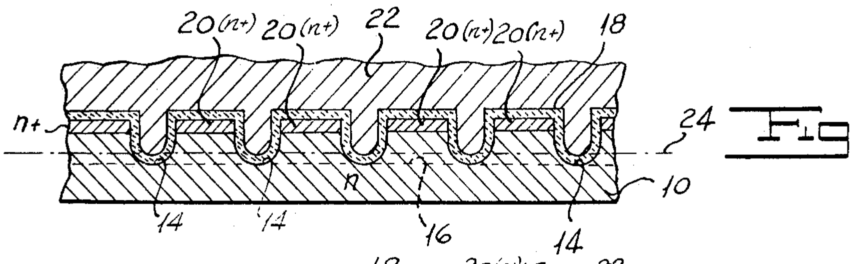
FIGURE 2 is a fragmentary sectional view of the slice illustrated in FIGURE 1 at a further point in my process of making a monolithic chip containing noncompatible oxide-isolated regions.

When the supporting structure 22 has been applied over the oxide coating 18, I lap the undersurface of the film 10 to a depth indicated by the dot-dash line 24 in FIGURE 2. The resultant structure shown in FIGURES 3 and 4 comprises a plurality of islands 26 of high resistivity n-type material superposed on the islands 20 of relatively low resistivity $n^+$-type material and surrounded by the oxide 18.

Referring now to FIGURES 5 to 8 in the next step of making my integrated circuit slice containing noncompatible oxide-isolated regions, I apply a layer 28 of relatively highly doped p-type material such as silicon, for example, to a relatively lightly doped parent body 30. This may be achieved by the epitaxial deposition technique using a boron halide dopant, for example. When the body 30 has been formed I etch through the layer 28 and into the body to form a plurality of generally parallel grooves 32 spaced by wider valleys 34 extending generally in the same direction. Generally parallel grooves 36 intersect the grooves 32 and the valleys 34 generally at right angles to define isolated portions 38 of the layer 28.

Figure 6:
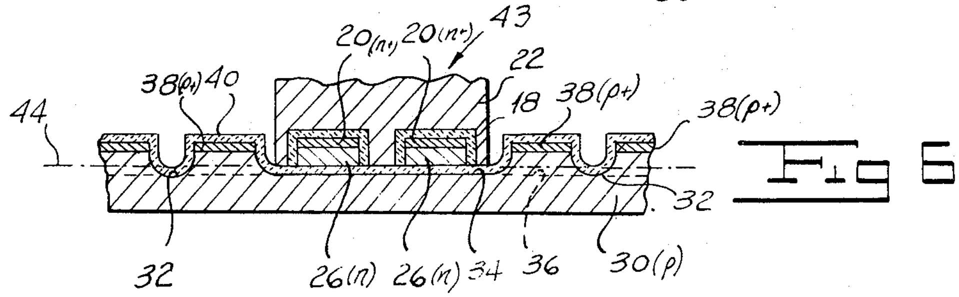
FIGURE 6 is a fragmentary sectional view illustrating subsequent steps in my process of making a monolithic chip containing noncompatible oxide-isolated regions.
Figure 7:
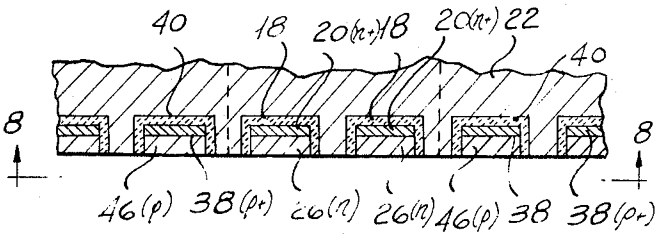
FIGURE 7 is a fragmentary section view of a monolithic, integrated circuit chip containing noncompatible oxide-isolated regions made according to my process.
Figure 8:
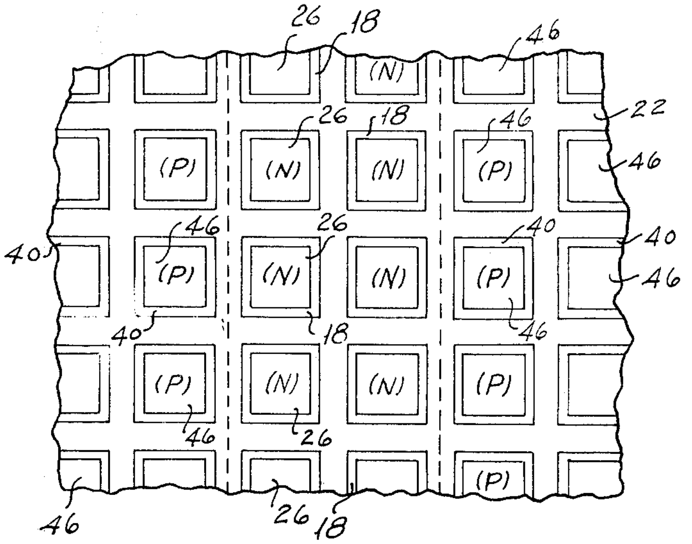
FIGURE 8 is a fragmentary bottom elevation of the chip shown in FIGURE 7 taken along the line 8—8 of FIGURE 7.

I make valleys 34 of a width equal to the distance between the centers of two grooves 14 adjacent a central groove 14. When the etching operation is complete, I form another oxide coating 40 over the exposed surface of body 30 and over the exposed surfaces of isolated regions 38. Next I score the body 22 along lines indicated by the dot-dash lines 42 in FIGURE 4 and break the body into strips. These strips, one of which is indicated generally by the reference character 43 in FIGURE 6, are placed facedown on the oxide covering the valleys 34 of the structure shown in FIGURE 6. That is, the exposed n-type regions or islands 26 contact the oxide.

When all of the operations described above are complete, I deposit additional supporting material 22 over the assembly shown in FIGURE 6 to form a support therefor. As was explained hereinabove, preferably I deposit a material such as silicon which is compatible with the material of which body 30 and regions 38 are formed. Next, I lap the undersurface of body 30 to a depth indicated by the dot-dash line 44 in FIGURE 6 to form the structure shown in FIGURE 7. This operation not only exposes the previously formed islands 26 of high resistivity n-type material superposed on the regions 16 of low resistivity $n^+$-type material but, also, it exposes islands 46 of high resistivity over the low resistivity regions 38 of $p^+$ low resistivity material. All unexposed parts of superposed regions 26 and 16 are surrounded by the oxide 18 while all unexposed parts of superposed regions 46 and 38 are surrounded by the oxide 40.

The structure thus far described is ideally suited for the formation of both p-n-p and n-p-n transistors in the same slice. For example, in order to form an n-p-n transistor I first diffuse a suitable impurity into region 26 over a limited area of the exposed surface thereof to provide a p-type base region 48. It will be appreciated that this is possible owing to the fact that the n-type region 26 into which the impurity is diffused is not so highly doped as would render change in its conductivity type impracticable. When the base region 48 has thus been formed, I diffuse an impurity into a restricted region 50 within the base region 48 to form an emitter region. Concomitantly with that operation I diffuse an n-type impurity into a region 52 outside region 48 to permit the collector contact to be applied thereto. This region provides a relatively low resistance path to the collector contact in the planar structure I have provided. These diffusions may be accomplished in a conventional manner known to the art.

A p-n-p transistor may be formed adjacent the n-p-n structure just described by first diffusing an impurity into a region 54 within one of the regions 46 and over a limited area to form the base region. When that is accomplished, a p-type impurity is diffused into a region 56 within the base region 54 to form an emitter region and within a region 58 outside region 54 to provide a relatively low resistance path to the collector contact.

In making my monolithic integrated circuit chip I first form a relatively highly doped film or layer 12 on a layer or body 10 of n-conductivity type, for example, by any means known to the art such as epitaxial deposition. I next etch through the film or layer 12 and into the body 10 to form intersecting grooves 14 and 16 and form an oxide coating 18 in the exposed areas. The supporting structure 22 can then be applied over the oxide as by epitaxially depositing polycrystalline silicon on the body. The chip is then lapped along the line 24 to form a plurality of oxide-isolated islands, each comprising an outer relatively lightly doped high resistivity layer over a relatively highly doped low resistivity layer 20. I score the chip along lines 42 and break it into strips indicated generally by the reference character 43.

Having provided the strips 43 I form a body including the layer 30 of relatively high resistivity p-type material carrying the film or layer 28 of highly doped $p^+$ material. Next the body is etched through the film 28 and into the body 30 to form the grooves 32, alternate ones of which are separated by relatively wider channels or valleys 34 as well as intersecting grooves 36. Next the oxide coating 38 is applied to the exposed surface and strips 43 can be laid in the channels 34 over the oxide coating with islands 26 in engagement with the oxide. Additional material, such as polycrystalline silicon, is epitaxially deposited and the body is lapped to a depth indicated by the dot-dash line 44 to form islands, each of which comprises a layer 46 on a layer 38, all of which islands are surrounded below the exposed surface by the oxide 38. At the same time the islands including layers 20 and 26 are exposed.

Figures 3, 4, 9:
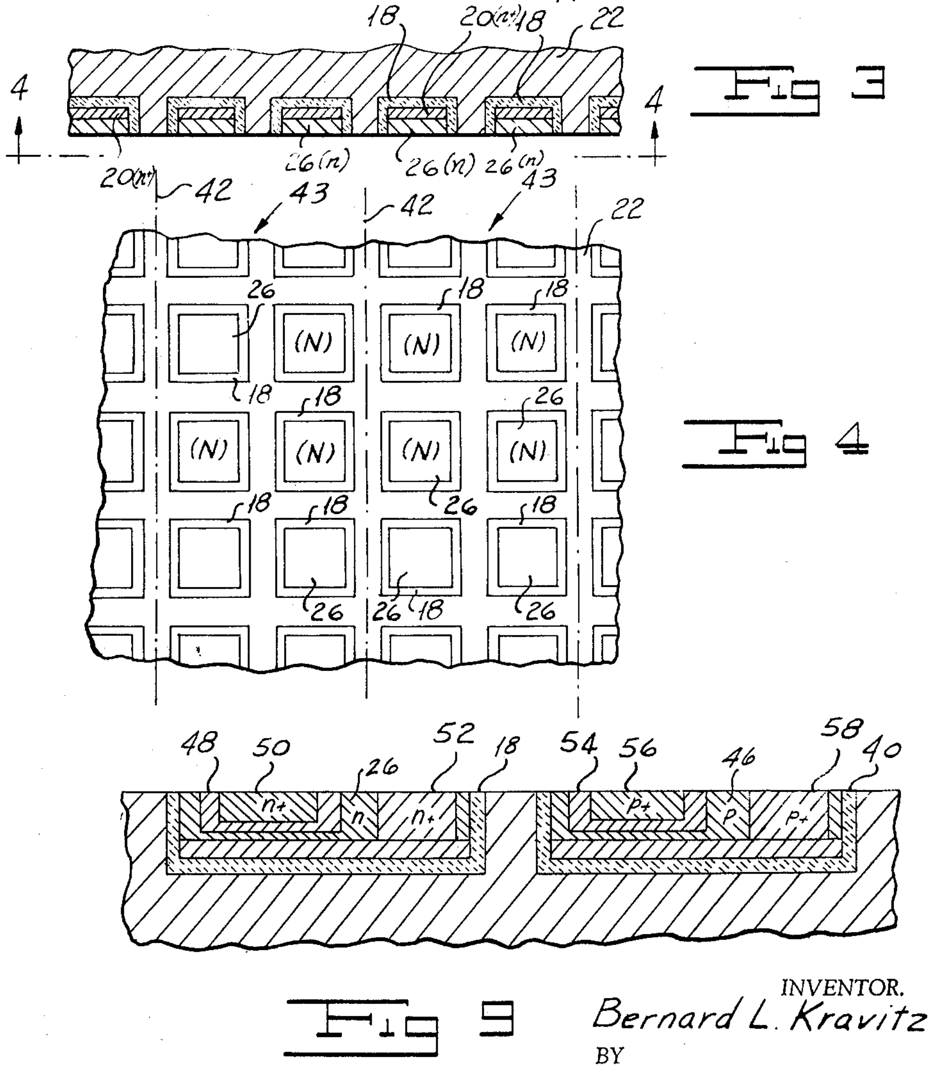
FIGURE 3 is a fragmentary sectional view of the slice illustrated in FIGURE 2 after further operations have been performed thereon.
FIGURE 4 is a bottom plan view of the slice shown in FIGURE 3 taken along the line 4—4 of FIGURE 3.
FIGURE 9 is a fragmentary sectional view of integrated circuit structures formed in my chip containing noncompatible oxide-isolated regions.
Figure 5:
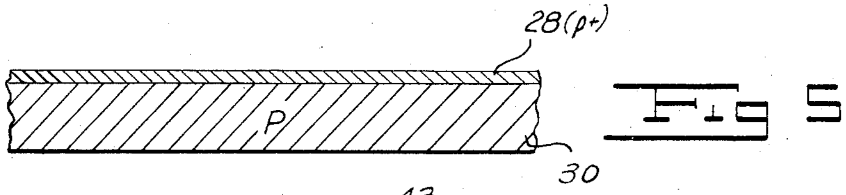
FIGURE 5 is a fragmentary sectional view of another silicon slice illustrating a still further step in my process of manufacturing a monolithic chip containing noncompatible oxide-isolated regions.

The structure thus far described is eminently suited for use in forming both n-p-n and p-n-p devices in the same slice in the manner illustrated in FIGURE 9. While I have shown and described my invention in connection with a silicon device, it will readily be understood that it is equally applicable to a germanium device.

It will be seen that I have accomplished the objects of my invention. I have provided a monolithic integrated circuit chip including noncompatible regions in their ideal form. My structure facilitates the formation of both n-p-n and p-n-p devices in the same chip. I have invented a method of making a monolithic integrated circuit chip containing noncompatible regions.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A method of making a monolithic integrated circuit chip including the steps of forming a plurality of intersecting grooves to a certain depth in one face of a first semiconductor body of one conductivity type, then depositing an insulating film over said face and over the surfaces of said grooves, depositing supporting material over said film and into said grooves, removing material from the other face of said body to a depth to expose said supporting material in said grooves to form a plurality of exposed areas of said body separated by said supporting material, forming a plurality of generally parallel grooves separated by a relatively wider channel to a certain depth in one face of a second semiconductor body of the other conducitivity type, forming other grooves intersecting said grooves in said second body face, depositing a film of insulating material over said one face of said second body and over the surfaces of said grooves and said channel, placing said first body in said channel with said other face adjacent said film with a plurality of said exposed body areas in said channel and with grooves of the first body aligned with intersecting grooves of the second body, depositing additional supporting material over the film on said other body and removing material from the other face of said second body to expose the supporting material in the grooves of said first and second bodies.

2. A method as in claim 1 in which said film forming step comprises forming a film of oxide.

3. A method as in claim 1 including the step of forming a relatively highly doped layer at said one face of each of said bodies before said groove and channel forming steps.

References Cited

UNITED STATES PATENTS

| | | | |
|---|---|---|---|
| 3,290,753 | 12/1966 | Chang | 29—577 |
| 3,320,485 | 5/1967 | Buie | 317—101 |
| 3,383,760 | 5/1968 | Shwartzman | 29—577 |
| 3,393,349 | 7/1968 | Huffman | 317—101 |
| 3,401,450 | 9/1968 | Godeyahn | 148—175 XR |

L. DEWAYNE RUTLEDGE, Primary Examiner

R. A. LESTER, Assistant Examiner

U.S. Cl. X.R.

29—577; 117—201; 148—174